(12) United States Patent
Wakiyama et al.

(10) Patent No.: US 6,982,489 B2
(45) Date of Patent: Jan. 3, 2006

(54) SEMICONDUCTOR DEVICE HAVING A PLURALITY OF LAMINATED SEMICONDUCTOR ELEMENTS WITH WATER ABSORBING RESIN FILMS INTERPOSED THEREBETWEEN

(75) Inventors: Satoru Wakiyama, Tokyo (JP); Kozo Harada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 13 days.

(21) Appl. No.: 10/652,039

(22) Filed: Sep. 2, 2003

(65) Prior Publication Data
US 2004/0195671 A1    Oct. 7, 2004

(30) Foreign Application Priority Data
Apr. 1, 2003    (JP)    ............................. 2003-098507

(51) Int. Cl.
  *H01L 23/48*    (2006.01)
  *H01L 23/52*    (2006.01)
  *H01L 29/40*    (2006.01)
(52) U.S. Cl. ...................... 257/778; 257/783; 257/686

(58) Field of Classification Search ................ 257/778, 257/783, 686
See application file for complete search history.

(56) References Cited

U.S. PATENT DOCUMENTS

| | | | | |
|---|---|---|---|---|
| 4,696,764 A | * | 9/1987 | Yamazaki | .................... 252/503 |
| 6,278,181 B1 | * | 8/2001 | Maley | ......................... 257/712 |
| 2003/0155664 A1 | * | 8/2003 | Sumita et al. | .............. 257/791 |
| 2004/0012098 A1 | * | 1/2004 | Yamazaki et al. | .......... 257/778 |

FOREIGN PATENT DOCUMENTS

| | | |
|---|---|---|
| JP | 61-288455 | 12/1986 |
| JP | 5-136207 | 6/1993 |

* cited by examiner

*Primary Examiner*—Phat X. Cao
(74) *Attorney, Agent, or Firm*—McDermott Will & Emery LLP

(57) ABSTRACT

A semiconductor device has a plurality of laminated semiconductor elements 2, and highly water-absorbing resin films 3 formed between the semiconductor elements. Here, the highly water-absorbing resin films 3 preferably contain water or a low-boiling-point organic solvent. Alternatively, the highly water-absorbing resin films may contain, or may be allowed to contain after packaging, an organic solvent having a boiling point equal to or higher than the reflow temperature of solder.

2 Claims, 3 Drawing Sheets

SEMICONDUCTOR DEVICE HAVING A PLURALITY OF LAMINATED SEMICONDUCTOR ELEMENTS WITH WATER ABSORBING RESIN FILMS INTERPOSED THEREBETWEEN

BACKGROUND OF THE INVENTION

1. Field of the Invention

The present invention relates to a semiconductor device having a plurality of laminated semiconductor elements.

2. Background Art

In order to reduce packaging areas, semiconductor devices having a plurality of laminated or densely packed semiconductor elements, such as a packaged module of a three-dimensional structure, have been developed. In particular, semiconductor devices having a plurality of laminated semiconductor elements are advantageous to the integration of semiconductor elements.

However, when a plurality of semiconductor elements are laminated, there is a problem of poor heat-dissipation efficiency of dissipating heat generated when the semiconductor elements operate, because of the distance between respective semiconductor elements. Especially, the heat-dissipation efficiency of semiconductor elements in the central portion where the upper and lower surfaces of the semiconductor elements are not exposed to the ambient air is poor.

The present invention is devised to solve the above-described problem, and the object of the present invention is to impart high heat-dissipation characteristics to a semiconductor device having a plurality of laminated semiconductor elements.

SUMMARY OF THE INVENTION

According to one aspect of the present invention, a semiconductor device has a plurality of laminated semiconductor elements and highly water-absorbing resin films formed between the semiconductor elements.

Other and further objects, features and advantages of the invention will appear more fully from the following description.

DETAILED DESCRIPTION OF THE PREFERRED EMBODIMENTS

First Embodiment

Figure 1:
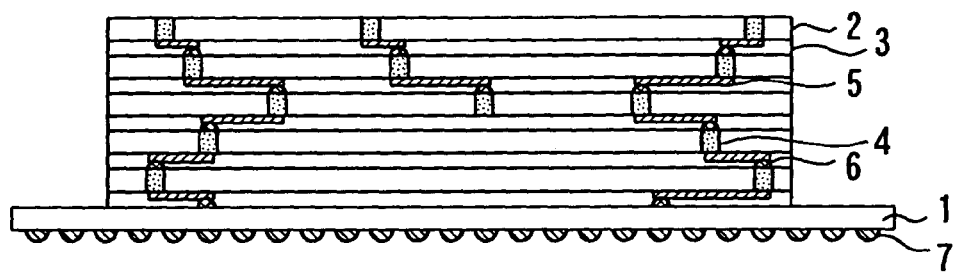
FIG. 1 is a sectional view showing a semiconductor device according to the first embodiment of the present invention.

FIG. 1 is a sectional view showing a semiconductor device according to the first embodiment of the present invention. In the semiconductor device, as FIG. 1 shows, a plurality of semiconductor elements 2 are laminated on a substrate 1. Highly water-absorbing resin films 3 are formed between the semiconductor elements 2. The highly water-absorbing resin films 3 adhere the semiconductor elements 2 to each other with the adhesive property thereof.

The semiconductor elements 2 have penetrating electrodes 4 that penetrate from the upper to lower surfaces thereof. The semiconductor elements 2 have an active element surface facing down, whereon redistribution wirings 5 are formed using plating. Next, in order to electrically connect the redistribution wirings 5 of a semiconductor element 2 to the penetrating electrodes 4 of an underlying semiconductor element 2, inner bumps 6 are formed. External electrodes 7 consisting of solder balls are formed on the bottom of the substrate 1.

The highly water-absorbing resin films 3 are formed from a highly water-absorbing resin obtained by the cross-linking reaction of monomers, such as (meth)acrylic acid wherein water or a low-boiling-point organic solvent is made to be absorbed to form a gel. The heat generated when each semiconductor element 2 operates can be cooled by the highly water-absorbing resin films 3. Furthermore, the stress caused by the warp of each semiconductor element 2 can be relaxed, and the failure of the connection of inner bumps 6 due to thermal stress, or the like, can be prevented by the highly water-absorbing resin films 3.

The organic solvent may have a boiling point equal to or higher than the reflow melting point temperature of the solder used in the external electrodes 7. Thereby, the organic solvent is prevented from boiling in the reflow process.

Second Embodiment

Figure 2A:
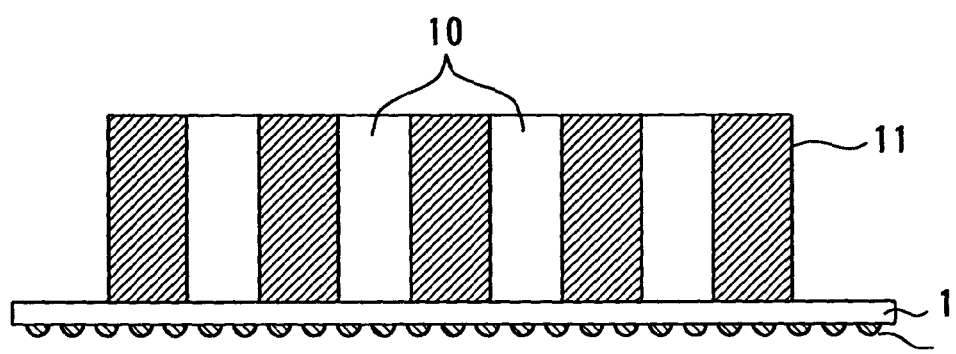
FIG. 2A is a sectional view showing a semiconductor device according to the second embodiment of the present invention.
Figure 2B:
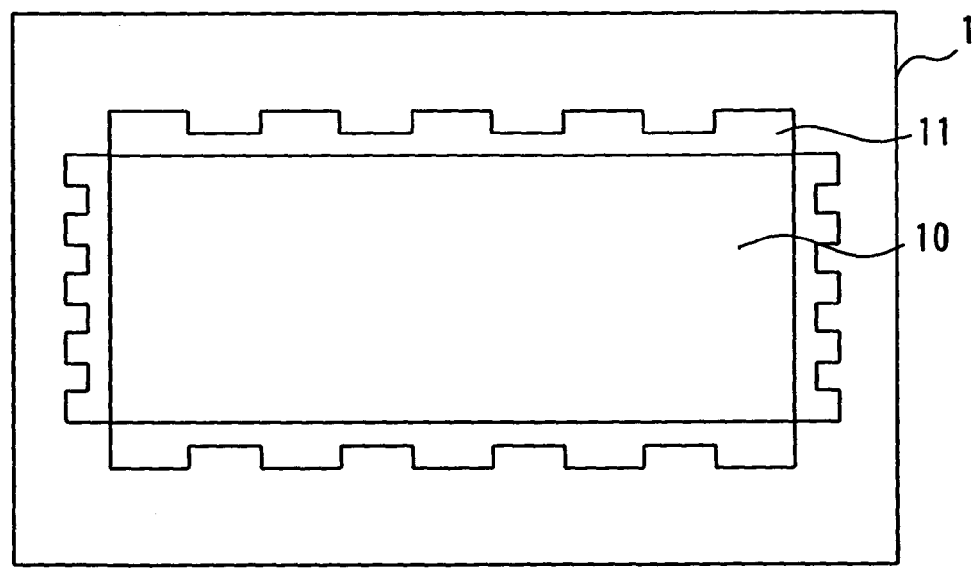
FIG. 2B is a plan view showing a semiconductor device according to the second embodiment of the present invention.

FIG. 2A is a sectional view showing a semiconductor device according to the second embodiment of the present invention, and FIG. 2B is a plan thereof. In the semiconductor device, heat-dissipating heat sinks 11 are adhered using an adhesive or a heat-dissipating adhesive to all the sides of a semiconductor device 10 wherein a plurality of semiconductor elements 2 are laminated with intervening highly water-absorbing resin films 3, as in the first embodiment. Thereby, heat dissipation is further improved.

Third Embodiment

Figure 3:
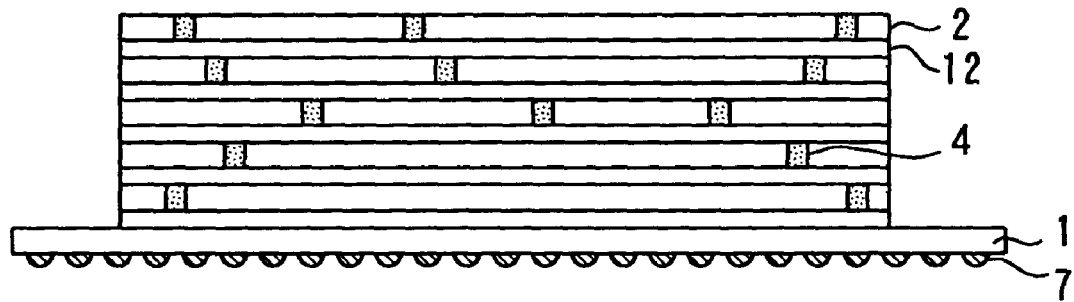
FIG. 3 is a sectional view showing a semiconductor device according to the third embodiment of the present invention.

FIG. 3 is a sectional view showing a semiconductor device according to the third embodiment of the present invention. The constituents same as in FIG. 1 will be denoted by the same reference numerals, and the description thereof will be omitted. In the semiconductor device, conductive resin films 12 are formed in the whole areas between semiconductor elements 2.

The conductive resin films 12 have a higher thermal conductivity than the ordinary under-fill resin films, and can efficiently dissipate heat of the semiconductor elements 2 into the ambient air. The conductive resin films 12 also ensure that the semiconductor elements 2 are electrically connected to each other.

Fourth Embodiment

Figure 4A:
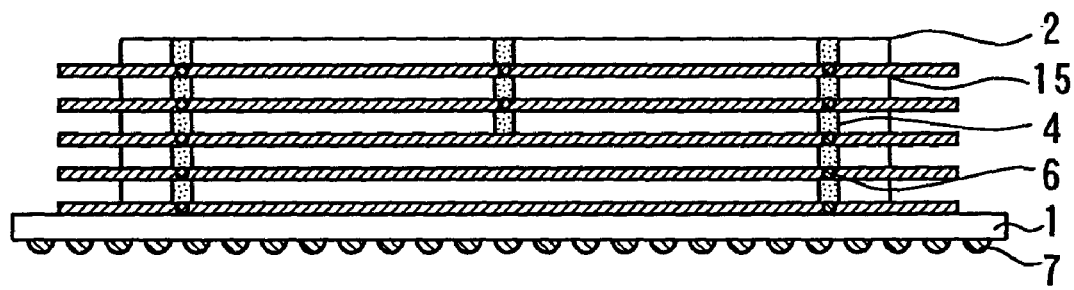
FIG. 4A is a sectional view showing a semiconductor device according to the fourth embodiment of the present invention.
Figure 4B:
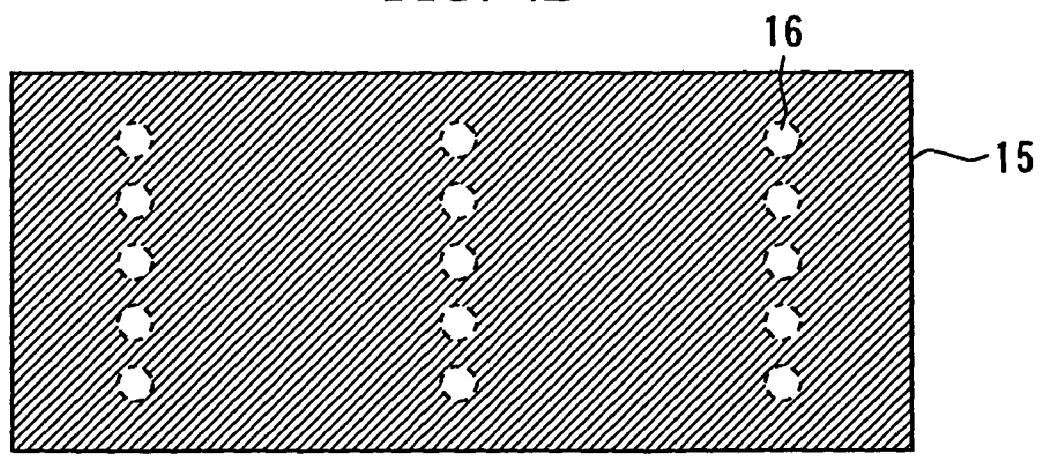
FIG. 4B is a plan view showing a metal plate of a semiconductor device according to the fourth embodiment of the present invention.

FIG. 4A is a sectional view showing a semiconductor device according to the fourth embodiment of the present invention. FIG. 4B is a plan view showing a metal plate of a semiconductor device according to the fourth embodiment of the present invention. The constituents same as in FIG. 1 will be denoted by the same reference numerals, and the description thereof will be omitted. In the semiconductor device, metal plates 15 are provided between semiconductor elements 2. The metal plates 15 are extended outwardly from portions between the semiconductor elements 2, and can efficiently dissipate heat from the semiconductor elements 2 from these extended portions into the ambient air. The metal plates 15 are adhered to the semiconductor elements 2 with an adhesive or a heat-dissipating adhesive. The metal plates 15 may be thin metal films.

Each of the metal plates 15 has openings 16, whose circumferences have been subjected to insulation treatment, in locations where the inner bumps 6 for conducting the adjacent semiconductor element 2 pass. Thereby, when the semiconductor elements 2 are electrically connected to each other, it is not required to extend the redistribution wirings 5 to the sides of the metal plates 15. Therefore, the wiring length of each semiconductor element 2 is shortened, and a high-speed transmission becomes possible. Since there is no need to extend wirings to the sides, heat sinks 11 as shown in FIG. 2A can be fixed to the entire sides of the semiconductor device, and heat dissipating characteristics can further be improved.

Fifth Embodiment

Figure 5:
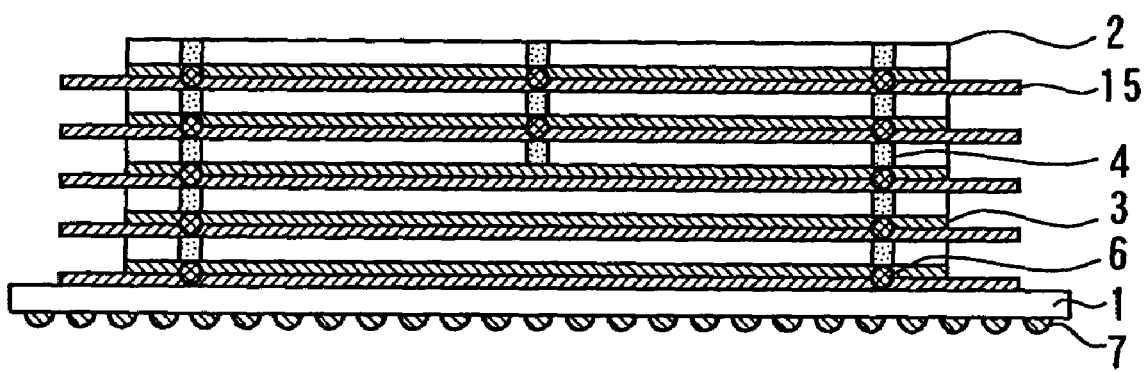
FIG. 5 is a sectional view showing a semiconductor device according to the fifth embodiment of the present invention.

FIG. 5 is a sectional view showing a semiconductor device according to the fifth embodiment of the present invention. The constituents same as in FIG. 1 will be denoted by the same reference numerals, and the description thereof will be omitted. In the semiconductor device, both the highly water-absorbing resin films 3, as in the first embodiment, and metal plates 15, as in the fourth embodiment, are provided between the semiconductor elements 2. Thereby, heat of the semiconductor elements 2 transmits to the metal plates 15 through the highly water-absorbing resin films 3, and is further efficiently dissipated.

The features and advantages of the present invention may be summarized as follows.

As described above, high heat dissipating characteristics can be imparted to a semiconductor device having a plurality of semiconductor elements.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-098507, filed on Apr. 1, 2003 including specification, claims, drawings and summary, on which the Convention priority of the present application is based, are incorporated herein by reference in its entirety.

What is claimed is:

1. A semiconductor device comprising:
   a plurality of laminated semiconductor elements; and
   highly water-absorbing resin films formed between the semiconductor elements, wherein
   the highly water-absorbing resin films absorb an organic solvent having a boiling point equal to or higher than the reflow melting point temperature of solder.

2. The semiconductor device according to claim 1, further comprising heat-dissipating heat sinks installed on the sides of the plurality of laminated semiconductor elements.

* * * * *